(12) United States Patent

Gu et al.

(10) Patent No.: US 12,674,841 B2

(45) Date of Patent: Jul. 7, 2026

(54) METHOD AND SYSTEM FOR DETECTING LITHIUM PRECIPITATION OF LITHIUM BATTERIES

(71) Applicant: SHANGHAI MAKESENS ENERGY STORAGE TECHNOLOGY CO., LTD., Shanghai (CN)

(72) Inventors: Danfei Gu, Shanghai (CN); Siyuan Chen, Shanghai (CN); Mingchen Jiang, Shanghai (CN); Xiao Yan, Shanghai (CN); Enhai Zhao, Shanghai (CN); Xiaohua Chen, Shanghai (CN)

(73) Assignee: Makesense Energy Technology Co., Limited., Shanghai (CN)

( * ) Notice: Subject to any disclaimer, the term of this patent is extended or adjusted under 35 U.S.C. 154(b) by 351 days.

(21) Appl. No.: 18/222,552

(22) Filed: Jul. 17, 2023

(65) Prior Publication Data

US 2024/0027529 A1 Jan. 25, 2024

(30) Foreign Application Priority Data

Jul. 19, 2022 (CN) .......................... 202210848365.4

(51) Int. Cl.
 *G01R 31/367* (2019.01)
 *G01R 31/3835* (2019.01)
(52) U.S. Cl.
 CPC ....... *G01R 31/367* (2019.01); *G01R 31/3835* (2019.01)
(58) Field of Classification Search
 CPC ....... Y02E 60/10; Y02E 10/542; Y02E 10/00; Y02E 20/00; Y02E 30/00; Y02E 40/00;

Y02E 50/00; Y02E 60/00; Y02E 70/00; H01M 10/0525; H01M 10/052; H01M 10/48; H01M 10/0567; H01M 10/0568; H01M 10/0569; H01M 10/425; H01M 2300/0045; H01M 2300/0068; H01M 10/39; H01M 4/0476; H01M 4/13;

(Continued)

(56) References Cited

U.S. PATENT DOCUMENTS

| | | | | |
|---|---|---|---|---|
| 2008/0309284 A1* | 12/2008 | Choksi | .................... | H02J 7/445 |
| | | | | 320/162 |
| 2010/0096199 A1* | 4/2010 | Raynor | .................... | B60K 8/00 |
| | | | | 180/65.1 |

(Continued)

*Primary Examiner* — Daniel Previl

(74) *Attorney, Agent, or Firm* — troutman pepper locke; Tim Tingkang Xia, Esq.

(57) ABSTRACT

The invention discloses method system for detecting lithium precipitation of lithium batteries. The method includes acquiring voltage-time data of lithium batteries of a battery module; performing feature extraction on the voltage-time data to obtain voltage-time data of charging and discharging in accordance with a preset range; performing an inflection point judgment on the voltage-time data of the charging and discharging; determining that there exists the inflection point, and grading the inflection point time when the inflection point occurs; and detecting an amount of lithium precipitation of the lithium batteries based on the grade of the inflection point time. The method combines data feature extraction and electrochemical model in big data and establishes a series of log and threshold system to detect and monitor lithium precipitation and early warn for lithium batteries.

8 Claims, 2 Drawing Sheets

(58) Field of Classification Search

CPC .............. H01M 4/525; H01M 10/054; H01M 2220/20; H01M 4/587; H01M 4/134; H01M 4/1395; H01M 10/4235; H01M 2004/021; H01M 2004/027; H01M 2300/0025; H01M 2300/0037; H01M 4/366; H01M 4/505; H01M 10/482; H01M 4/04; H01M 4/382; H01M 4/5825; H01M 10/0565; H01M 10/441; H01M 10/443; H01M 2004/028; H01M 4/661; H01M 4/666; H01M 4/70; H01M 50/414; H01M 50/46; H01M 50/491; H01M 6/164; H01M 6/168; H01M 10/0562; H01M 2010/4271; H01M 2300/0028; H01M 4/136; H01M 4/36; H01M 4/622; H01M 10/056; H01M 10/0566; H01M 10/058; H01M 10/44; H01M 10/486; H01M 10/488; H01M 2220/10; H01M 2300/0022; H01M 4/0404; H01M 4/0471; H01M 4/0473; H01M 4/131; H01M 4/133; H01M 4/139; H01M 4/1397; H01M 4/583; H01M 4/62; H01M 4/628; H01M 4/76; H01M 50/417; H01M 50/429; H01M 6/166; H01M 10/02; H01M 10/0413; H01M 10/045; H01M 10/0459; H01M 10/0468; H01M 10/0486; H01M 10/049; H01M 10/0585; H01M 10/4242; H01M 10/54; H01M 16/00; H01M 2200/10; H01M 2300/0071; H01M 2300/0082; H01M 2300/0094; H01M 4/0435; H01M 4/1391; H01M 4/485; H01M 4/621; H01M 4/625; H01M 50/107; H01M 50/342; H01M 50/3425; H01M 50/375; H01M 50/516; H01M 50/586; H01M 50/595; H01M 6/181; H01M 6/5033; H01M 10/42; H01M 4/00; H01M 8/00; H01M 6/00; H01M 10/00; H01M 12/00; H01M 14/00; H01M 50/00; H01M 2200/00; H01M 2220/00; H01M 2250/00; H01M 2300/00; H01G 11/60; H01G 11/62; H01G 11/64; H01G 11/58; H01G 11/06; H01G 9/2013; H01G 11/30; H01G 11/46; H01G 11/52; H01G 9/2009; H01G 9/2036; Y02P 70/50; B01J 2/006; B22F 1/16; B22F 2999/00; C01B 25/45; C01B 35/128; C04B 41/81; C07D 251/30; C07D 295/15; C07F 9/572; C07F 5/02; C07F 9/65522; C07F 9/657145; C07F 9/65742; C07F 9/6584; C07F 5/022; C07F 5/04; C23C 16/00; C23C 16/403; C23C 16/405; C23C 16/4417; C23C 16/442; C23C 16/45544; C23C 16/45555; C23C 16/45561; C23C 16/52; G01R 31/392; G01R 31/367; G01R 31/3835; G01R 31/396; G01R 31/387; G01R 31/382; G01R 31/3828; G01R 1/00; G01R 3/00; G01R 5/00; G01R 7/00; G01R 9/00; G01R 11/00; G01R 13/00; G01R 15/00; G01R 17/00; G01R 19/00; G01R 21/00; G01R 22/00; G01R 23/00; G01R 25/00; G01R 27/00; G01R 29/00; G01R 31/00; G01R 33/00; G01R 35/00; H02J 7/00047; H02J 7/0071; H02J 7/007182; H02J 7/00041; H02J 7/0045; H02J 7/0047; H02J 7/0048; H02J 7/0069; H02J 7/00712; H02J 1/00; H02J 1/08; H02J 2207/20; H02J 2300/20; H02J 2310/12; H02J 7/005; H02J 7/00714; H02J 7/02; H02J 7/04; H02J 7/342; H02J 7/345; H02J 9/02; H02J 9/061; H02J 2105/37; H02J 7/82; H02J 7/875; H02J 7/92; H02J 7/933; H02J 7/96; H02J 7/80; H02J 7/84; H02J 3/00; H02J 4/00; H02J 7/00; H02J 11/00; H02J 9/00; H02J 13/00; H02J 15/00; H02J 50/00; H02J 2101/00; H02J 2103/00; H02J 2105/00; H02J 2107/00; H02J 2207/00; B60L 2240/545; B60L 2240/547; B60L 2240/549; B60L 58/16; B60L 3/0046; B60L 58/12; B60L 58/21; B60L 58/22; B60L 50/60; B60L 53/126; B60L 53/32; Y02T 10/70; Y02T 10/7072; Y02T 90/12; Y02T 90/14; B64D 43/00; Y10T 29/49108; C01G 45/12; C01G 45/1242; C01G 53/00; C01G 53/50; C01G 53/82; C01P 2002/32; C01P 2002/52; C01P 2002/76; C01P 2004/51; C01P 2004/61; C01P 2002/00; C01P 2004/00; C01P 2006/00; C07C 211/63; C07C 217/08; G01N 33/20; G06F 1/266; G06F 13/10; G06F 13/20; G06F 13/385; G06F 13/4282; G07C 5/008; G07C 5/0858; H01B 1/06; H01B 1/122; H04L 67/125; H04L 67/568; H04L 12/10; B23K 13/01

USPC .............. 340/636.1, 636.12, 636.13, 636.15, 340/636.19, 660, 661, 662–664, 693.2, 340/693.7, 3.3, 825.27

See application file for complete search history.

(56) References Cited

U.S. PATENT DOCUMENTS

| | | | |
|---|---|---|---|
| 2011/0181242 A1* | 7/2011 | Lee | H02J 7/00047 |
| | | | 320/110 |
| 2012/0158330 A1* | 6/2012 | Araki | H01M 10/48 |
| | | | 702/63 |
| 2014/0377604 A1* | 12/2014 | Tenzer | H01M 4/1395 |
| | | | 429/61 |
| 2021/0408816 A1* | 12/2021 | Chen | H02J 7/00712 |
| 2023/0221373 A1* | 7/2023 | Deng | G01R 31/3835 |
| | | | 324/433 |

* cited by examiner

METHOD AND SYSTEM FOR DETECTING LITHIUM PRECIPITATION OF LITHIUM BATTERIES

CROSS-REFERENCE TO RELATED PATENT APPLICATION

This application claims priority to and the benefit of Chinese Patent Application No. 202210848365.4, filed Jul. 19, 2022, which are incorporated herein in their entireties by reference.

FIELD OF THE INVENTION

The invention relates generally to the field of lithium batteries, and more particularly to method and system for detecting lithium precipitation of lithium batteries.

BACKGROUND OF THE INVENTION

In the context of global "carbon neutral", the search for clean energy that can replace petroleum energy continues to heat up. Solar energy, tidal energy, wind energy, water energy, etc. are clean and sustainable energy sources, but the controllability of media that generate energy is relatively not very strong. Lithium batteries are currently a new generation of batteries, which have high energy density and long cycle life, and are widely used in mobile communications, digital technology, electric vehicles, energy storage and other fields. The demand for lithium batteries and materials thereof in the future is incalculable, and the corresponding upstream and downstream industrial chains have a huge market. By establishing a physical and chemical model for the lithium battery, and obtaining the simulation numerical values of the physical and chemical state quantities in the space and time inside the lithium battery, the real-time working state of the lithium battery can be clearly known and monitored, so that the economy, reliability and safety of the lithium battery are better guaranteed.

Lithium ions are prone to lose or temporarily lose their activity and precipitate on the surface of the electrode material inside the lithium battery to form metal lithium. This phenomenon is called "lithium precipitation". Lithium precipitation leads to the reduction of available lithium ions inside the battery, increased heat release, the macroscopic manifestation of reduced capacity, and easy rise in temperature after work. More dangerous, lithium ions are easy to precipitate into lithium dendrites, resulting in a decrease in the potential gradient of the local electric field, causing internal short circuits to varying degrees, and even physically piercing the separator. Therefore, it is necessary to detect/monitor the lithium precipitation of the lithium battery, and take measures or even retire the lithium battery if the lithium precipitation is serious to a certain extent.

The traditional lithium-ion battery lithium precipitation detection method needs to disassemble the battery that may have lithium precipitation, and then check it afterwards, without any predictability, which is not conducive to project implementation, and has no economic sense. The existing non-destructive method for detecting lithium precipitation is based on the judgment of the minimum value of the battery voltage time or the judgment of the battery relaxation platform, but in actual engineering applications, due to the existence of sampling time intervals, the data are discrete and have a certain degree of distortion. There will be certain omissions. In addition, the existing non-destructive lithium precipitation method is based on the deduction and comparison of lithium precipitation by the equivalent circuit method. In essence, this method cannot provide any information on the internal physical parameters of lithium batteries and must be recorded and compared through prior experimental data. It is not conducive to engineering applications and lacks predictability.

SUMMARY OF THE INVENTION

In view of the above-noted shortcomings of the prior art, one of the objectives of this invention is to provide a method and a system for detecting lithium precipitation of lithium batteries, to solve the problems in the prior art.

In one aspect of the invention, the method for detecting lithium precipitation of lithium batteries comprises acquiring voltage-time data of lithium batteries of a battery module; performing feature extraction on the voltage-time data to obtain voltage-time data of charging and discharging in accordance with a preset range; performing an inflection point judgment on the voltage-time data of the charging and discharging; determining that there exists the inflection point, and grading the inflection point time when the inflection point occurs; and detecting an amount of lithium precipitation of the lithium batteries based on the grade of the inflection point time.

In some embodiments, said performing the feature extraction on the voltage-time data to obtain the voltage-time data of charging and discharging in accordance with the preset range comprises judging whether the charging and discharging voltage-time data meet the preset range, or not, which comprises the steps of judging whether the voltage value within a first time threshold after the charging or discharging is cut off is lower than a second voltage threshold; if so, judging whether the time of the voltage value that is lower than the second voltage threshold is lower than a third time threshold, or not; and if so, determining that the charging and discharging voltage-time data meets the preset range.

In some embodiments, said determining that there exists the inflection point, and said grading the inflection point time when the inflection point occurs comprises calculating a time difference between the inflection point time and the cut-off time in the charging and discharging voltage-time data; and grading the inflection point time according to the time difference.

In some embodiments, said detecting an amount of lithium precipitation of the lithium batteries based on the grade of the inflection point time comprises when the inflection point time is smaller than a fourth time threshold, establishing a log file of the inflection point time; and when the inflection point time reaches a fifth time threshold, forcing the lithium battery to stop operating; wherein a maximum value of the fourth time threshold is less than a minimum value of the fifth time threshold.

In some embodiments, said detecting an amount of lithium precipitation of the lithium batteries based on the grade of the inflection point time further comprises when the inflection point time is greater than the fourth time threshold and smaller than the fifth time threshold, performing analog simulation on the charging data or the discharging data of the lithium battery to obtain a corresponding amount of the lithium precipitation; and establishing a log file for the amount of the lithium precipitation.

In some embodiments, said establishing the log file of the amount of the lithium precipitation comprises when the amount of the lithium precipitation is determined to be larger than a sixth lithium precipitation amount threshold and smaller than a seventh lithium precipitation amount threshold, calculating the time when the amount of the lithium precipitation reaches the seventh lithium precipitation amount threshold through a time sequence model or an artificial intelligence model; and early warning the amount of the lithium precipitation based on the time when the amount of the lithium precipitation reaches the seventh lithium precipitation amount threshold value.

In some embodiments, further comprising when the amount of the lithium precipitation reaches the seventh lithium precipitation amount threshold, forcing the lithium battery to stop operating.

In another aspect of the invention, the system for detecting lithium precipitation of lithium batteries comprises an acquisition module configured to acquire voltage-time data of a lithium battery of one module; an extraction module configured to perform feature extraction on the voltage-time data to obtain voltage-time data of charging and discharging that meets a preset range; a judgment module configured to perform inflection point judgment on the charging and discharging voltage-time data; a grade module, configured to determine the existence of the inflection point and grade the inflection time at which the inflection point occurs; and a detection module, configured to detect a lithium precipitation amount of the lithium battery based on the level of the inflection point time.

In some embodiments, the extraction module is further configured to judge whether the charging and discharging voltage-time data meets the preset range, or not, comprising the steps of judging whether the voltage value within a first time threshold after the charging or discharging is cut off is lower than a second voltage threshold; if so, judging whether the time of the voltage value that is lower than the second voltage threshold is lower than a third time threshold, or not; and if so, determining that the charging and discharging voltage-time data meets the preset range.

In some embodiments, the grade module is further configured to calculate the time difference between the inflection point time and the cut-off time in the charging and discharging voltage-time data; and grading the inflection point time according to the time difference.

Compared with the prior art, the method and system for detecting lithium precipitation of the lithium batteries have the following beneficial effects.

The invention adopts the method of combining data feature extraction and electrochemical model in big data, and establishes a series of log and threshold system to detect and monitor lithium precipitation and early warn for lithium batteries.

The invention can avoid disassembling to understand the internal lithium precipitation condition, thereby evaluating the safety state and the competitive state of the lithium batteries.

BRIEF DESCRIPTION OF THE DRAWINGS

The accompanying drawings illustrate one or more embodiments of the invention and, together with the written description, serve to explain the principles of the invention. The same reference numbers may be used throughout the drawings to refer to the same or like elements in the embodiments.

DETAILED DESCRIPTION OF THE INVENTION

Figure 1:
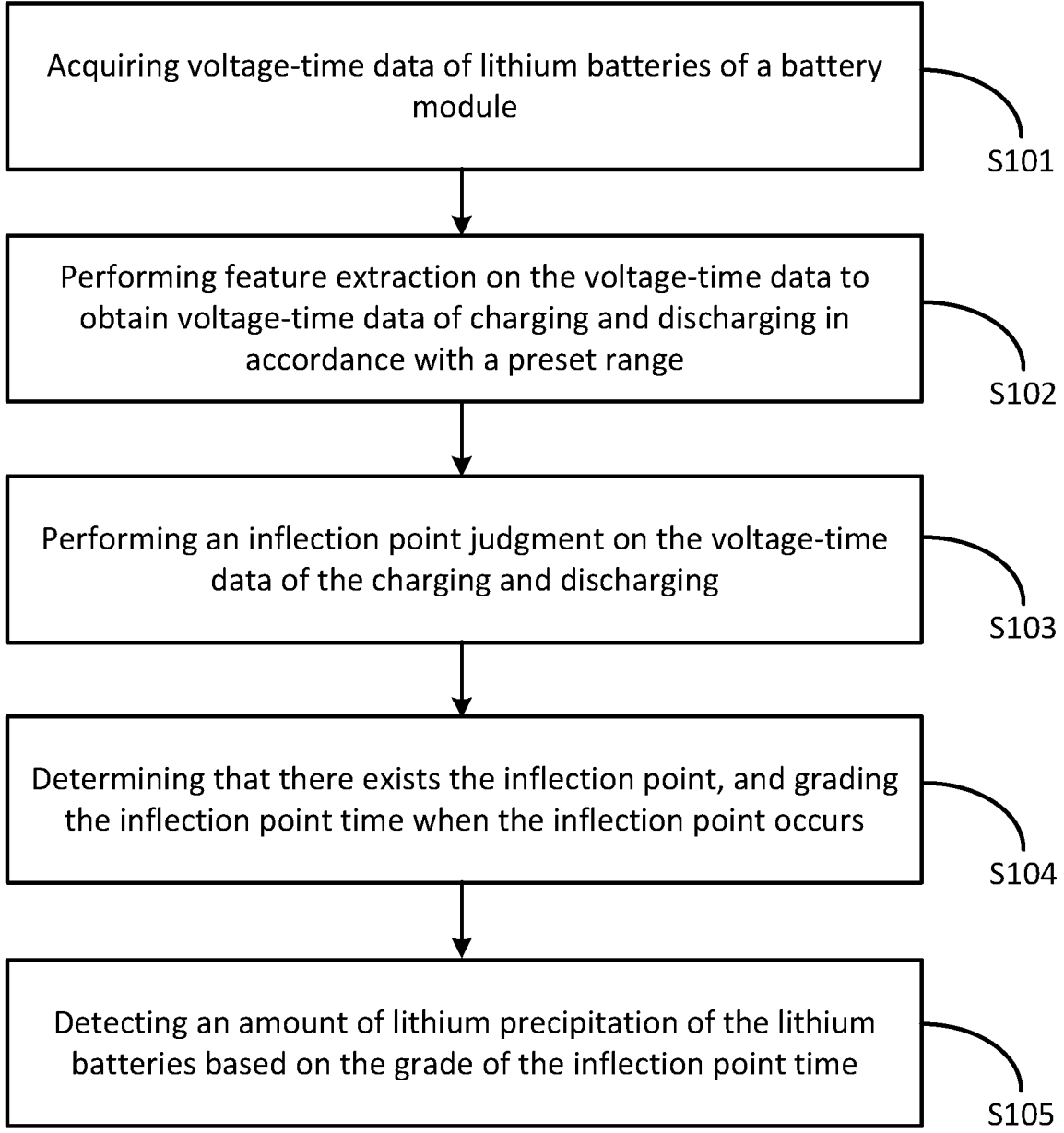
FIG. 1 is a flow chart of a method for detecting lithium precipitation of lithium batteries according to one embodiment of the invention.

Embodiments of the invention are described below through specific examples in conjunction with the accompanying drawings in FIGS. 1-2, and those skilled in the art can easily understand other advantages and effects of the invention from the content disclosed in this specification. The invention can also be implemented or applied through other different specific implementations, and various modifications or changes can be made to the details in this specification based on different viewpoints and applications without departing from the spirit of the invention. It should be noted that, in the case of no conflict, the following embodiments and features in the embodiments can be combined with each other.

It should be noted that the drawings provided in the following embodiments are merely illustrative in nature and serve to explain the principles of the invention, and are in no way intended to limit the invention, its application, or uses. Only the components related to the invention are shown in the drawings rather than the number, shape and size of the components in actual implementations. For components with the same structure or function in some figures, only one of them is schematically shown, or only one of them is marked. They do not represent the actual structure of the product. Dimensional drawing, the type, quantity and proportion of each component can be changed arbitrarily in its actual implementations. More complicate component layouts may also become apparent in view of the drawings, the specification, and the following claims.

The terminology used herein is for the purpose of describing particular embodiments only and is not intended to be limiting of the invention. As used herein, "a" not only means "only one", but also means "more than one". The term "and/or" used in the description of the present application and the appended claims refers to any combination and all possible combinations of one or more of the associated listed items, and includes these combinations. The terms "first", "second", etc. are only used for distinguishing descriptions, and should not be construed as indicating or implying relative importance.

Figure 2:
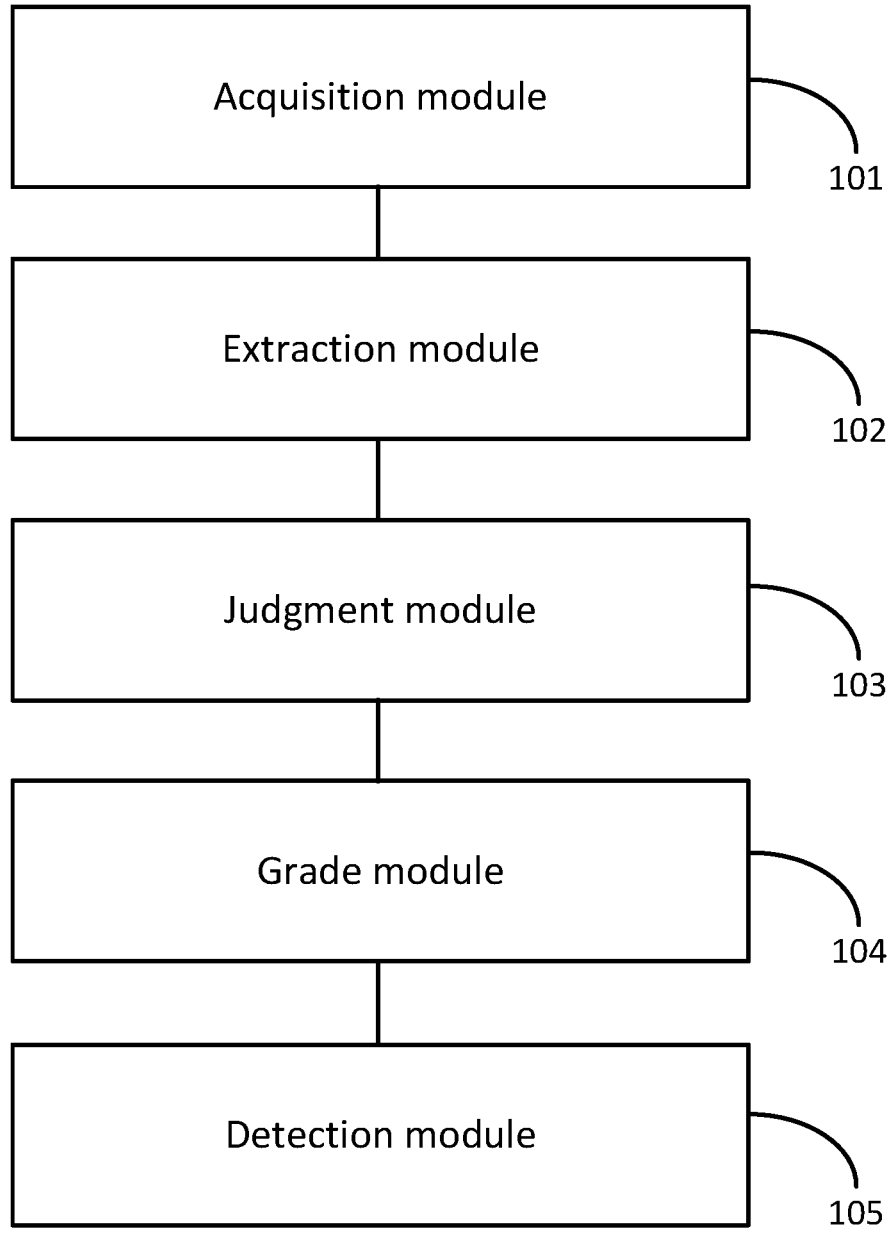
FIG. 2 is a schematic diagram of a system for detecting lithium precipitation of lithium batteries according to one embodiment of the invention.

Referring to FIG. 1, a method for detecting lithium precipitation of lithium batteries is schematically shown according to one embodiment of the invention. The method includes the following steps.

At step S101, acquiring voltage-time data of lithium batteries of one module.

Specifically, the voltage-time data is acquired by voltage sensors in a battery management system.

It should be noted that modules generally have levels such as single cell, box, cluster, and stack, etc. Each level is a certain electrical topology. Corresponding to each level, the battery management system has voltage sensing. In practice, the invention is limited by the physical mounting conditions of the sensors.

The voltage-time data of all the batteries of a certain module level in an application scenario is collected (acquired), where the module level is limited by the level of the collecting sensors. Preferably, the cluster-level voltage-time data is used when the data is taken to the cluster level, otherwise the battery voltage-time data of the lowest module level is used. For those with special requirements, the voltage-time data of a single-level battery can be collected.

At step S102, performing feature extraction on the voltage-time data to obtain the voltage-time data of charging and discharging that meets a preset range.

Specifically, the judgment of whether the charging and discharging data is qualified is used as a judgment basis for monitoring an amount of the lithium precipitation.

At step S103, performing an inflection point judgment on the voltage-time data of charging and discharging.

Specifically, whether an inflection point exists or not and the time when the inflection point is present from the cutoff time are judged for the extracted voltage-time data.

The definition of an inflection point on a continuous function (curve) is a point where the second-order derivative is 0 and the left and right second-order derivatives change sign.

In the invention, as intuitively seen, the voltage-time data is a graph of a curve, the inflection point is a point where the curve changes convexity, i.e., from being convex up to being convex down before and after this point, or vice versa. But for discrete data, it is defined as the point before and after which the second order difference quotient changes sign.

In a specific embodiment, within the time window of 3600 s, the absolute value of the current does not exceed 3 A, and if there exists a current less than 3 A, its total duration does not exceed 300 s.

Definition of an inflection point: an inflection point, also called as a reverse curve point, refers to a point of a curve at which a change in the direction of curvature occurs in mathematics. Intuitively speaking, an inflection point is a point where the tangent line passes through the curve, that is, a dividing point between a concave arc and a convex arc of a continuous curve.

The invention is realized by carrying out differential calculation on the voltage-time data, namely carrying out calculation of subtracting one from the other on a voltage-time sequence to obtain a new time sequence, and paying attention to the time point when the new time sequence has a significant change in sign, that is, inflection point.

At step S104, determining that the inflection point exists, and grading the inflection point time at which said inflection point occurs.

Specifically, grading the time from the inflection point time at which said inflection point occurs to the cut-off time.

At step S105, detecting an amount of the lithium precipitation of the lithium batteries based on the grade of the inflection point time.

The invention provides a method for detecting lithium precipitation of lithium batteries based on the feature extraction of the battery data and an electrochemical model. The method comprises, firstly collecting the voltage-time data of all the batteries of a certain module level in an application scenario, extracting the cut-off time of each charging and discharging in the data set through data features, then carrying out inflection point detection on the voltage-time data in the relaxation time after the cut-off time, and determining whether an inflection point exists and the time from the inflection point time from the cut-off time, carrying out strategy processing on the data with time greater than different thresholds, substituting the battery voltage data exceeding the strictest threshold into an electrochemical model for simulation, deducing and simulating the lithium precipitation of the lithium batteries according to the battery operation situation, and monitoring and early warning through the establishment of logs.

In the exemplary embodiment, through the judgment of charging and discharging cut-off and the extraction of the inflection point time of the battery data, the deductive simulation of the electrochemical model on the lithium precipitation, and the threshold judgment and the grading system, the effectiveness and economic benefit are ensured.

In one embodiment, said performing the feature extraction on the voltage-time data to obtain the voltage-time data of charging and discharging that meets the preset range includes judging whether the charging and discharging voltage-time data meets the preset range, or not, which specifically comprises the steps of:

judging whether the voltage value within a first time threshold after the charging or discharging is cut off is lower than a second voltage threshold;

if so, judging whether the time of the voltage value that is lower than the second voltage threshold is lower than a third time threshold, or not; and if so, determining that the charging and discharging voltage-time data meets the preset range.

Specifically, the first time threshold, i.e., threshold 1, the second voltage threshold, i.e., threshold 2, and the third time threshold, i.e., threshold 3, are determined in order to screen and clean qualified charging and discharging data for data processing. The required charging and discharging data are the data of the batteries that are sufficiently stationary after the charging or discharging is cut off. A sufficient criterion here is that no current exceeding threshold 2 is allowed to be present during the time period of threshold 1, and that the current below threshold 2 is present for less than the time period of threshold 3 in total during the time period of threshold 1.

In one exemplary embodiment, the absolute value of the current does not exceed 3 A in the time window of 3600 s, and the total duration does not exceed 300 s if the current less than 3 A is present.

In one embodiment, said determining that the inflection point exists, and said grading the inflection point time at which the inflection point occurs includes calculating the time difference between the inflection point time and the cut-off time in the charging and discharging voltage-time data; and grading the inflection point time according to the time difference.

In one embodiment, said detecting an amount of the lithium precipitation of the lithium batteries based on the grade of the inflection point time includes when the inflection point time is smaller than a fourth time threshold, establishing a log file of the inflection point time; when the inflection point time reaches a fifth time threshold, forcing the lithium battery to stop operating; wherein a maximum value of the fourth time threshold is less than a minimum value of the fifth time threshold.

Specifically, the fourth time threshold, i.e., threshold 4, and the fifth time threshold, i.e., threshold 5, are thresholds for performing three-level early warning responses to the inflection point time at which said inflection point occurs. When the inflection point time is below threshold 4, no lithium precipitation is evident, but a log is made. When the inflection point time is between threshold 4 and threshold 5, calculation and simulation on the specific lithium precipitation condition are required, and a big data model or an electrochemical model can be adopted for simulation. Retirement of the batteries is forced when the inflection point time is above threshold 5.

In one embodiment, said detecting the amount of the lithium precipitation of the lithium battery based on the grade of the inflection point time further comprises when the inflection point time is greater than the fourth time threshold and smaller than the fifth time threshold, performing analog simulation on the charging data or the discharging data of the lithium battery to obtain a corresponding amount of the lithium precipitation; and creating a log file for the amount of the lithium precipitation.

In one embodiment, said creating a log file for the amount of the lithium precipitation further comprises when the amount of the lithium precipitation is determined to be larger than a sixth lithium precipitation amount threshold and smaller than a seventh lithium precipitation amount threshold, calculating the time when the amount of the lithium precipitation reaches the seventh lithium precipitation amount threshold through a time sequence model or an artificial intelligence model; and early warning on the amount of the lithium precipitation based on the time when the amount of the lithium precipitation reaches the seventh lithium precipitation amount threshold value.

When the amount of the lithium precipitation reaches the seventh lithium precipitation amount threshold, the lithium battery is forced to stop operating.

Specifically, for the simulation situation of the amount of lithium precipitation between threshold 4 and threshold 5, the three-level early warning response is carried out. The corresponding two thresholds are the sixth lithium analysis threshold, i.e., threshold 6, and the seventh lithium analysis threshold, i.e., threshold 7. The situation between threshold 6 and threshold 7 is calculated to predict a situation when it reaches threshold 7. If the predicted situation is above threshold 7, the battery is forced to retire.

Exemplarily, after monitoring the voltage data for 3000 s, the time when the inflection point appears is, for example, 1400 s, which is a three-level response, and corresponds to two threshold determinations, namely threshold 4 and threshold 5.

For example, for the judgment of 1400 s, its relation with 1000 s and 1500 s is judged, and then operation is carried out according to the relation. If 1400 s is larger than 1000 s and smaller than 1500 s, the lithium battery has certain lithium precipitation, but not being superlatively serious. And at the moment, the amount of the lithium precipitation is subjected to artificial intelligence recognition or simulation to obtain the amount of the lithium precipitation in the voltage discharging, and then the amount of the lithium precipitation is judged. Here is another three-level response, corresponding to the other two threshold determinations, namely threshold 6 and threshold 7.

In one embodiment, the invention provides a method for detecting lithium precipitation of the lithium battery based on battery data extraction and an electrochemical model.

The method comprises, firstly, collecting the voltage-time data of all the batteries of a certain module level of an application scenario, extracting cut-off time of each charging and discharging in the data set through data features, then carrying out inflection point detection on the voltage-time data in the cut-off relaxation time, determining whether an inflection point exists and the time of the inflection point from the cut-off time, and carrying out grading processing on the data of which the time is greater than different thresholds.

For some levels, for example: for a single cell level, the data: the electrochemical parameters required for the simulation of the electrochemical model and the environment and working conditions of the real battery twinned by the virtual battery, is substituted into the electrochemical model for simulation, the simulation lithium battery lithium precipitation condition is deduced according to the battery operation condition, the physical significance and numerical simulation and algorithm optimization of the model are related, and monitoring and early warning are carried out through the establishment of logs for all levels.

The method for detecting lithium precipitation of the lithium battery based on battery data feature extraction and an electrochemical model comprises the following steps.

Step S1, battery voltage-time data acquisition.

The voltage-time data is acquired by voltage sensors in a battery management system. Generally, the modules have levels such as single cell, box, cluster, and stack, etc. Each level is a certain electrical topology. Corresponding to each level, the battery management system has voltage sensing. In practice, the invention is limited by the physical mounting conditions of the sensors.

The method comprises collecting the voltage-time data of all the batteries of a certain module level in an application scenario, where the module level is limited by the level of the collecting sensors. Preferably, the cluster-level voltage-time data is used when the data is taken to the cluster level, otherwise the battery voltage-time data of the lowest module level is used. For those with special requirements, the voltage-time data of a single-level battery can be collected.

Step S2, barter voltage-time data extraction.

The method comprises extracting the voltage-time data of the battery. Firstly, the qualified charging and discharging data are extracted. The basic requirement is that the total duration of charging or discharging with a current lower than a certain threshold 2 within a certain threshold 1 after the cut-off of charging or discharging is lower than a certain threshold 3. This extraction can be logically judged based on the collected data, or it can be extracted through the underlying feature extraction methods of artificial intelligence such as convolution.

For example, if a battery is discharged and cut off, the voltage-time data within 3000 s after the battery is discharged and cut off is taken, the number of seconds of the time corresponding to the voltage with the voltage value lower than 2.8V in the voltage data of 3000 s is obtained, and whether the number of seconds is lower than 1500 s is further judged.

Of them, 3000 s is threshold 1, 2.8V is threshold 2, and 1500 s is threshold 3. The method is mainly used for judging whether the charging and discharging data are qualified or not as a judgment basis for lithium precipitation monitoring/detection.

Step S3, inflection point determination: firstly, judging the inflection point, and judging the amount of the lithium precipitation of the sub-node when the inflection point is larger than threshold 4 and smaller than threshold 5. Forced retirement when the amount of the lithium precipitation is large. When the amount of the lithium precipitation is not very large, determining how long that the amount of the lithium precipitation will be very large, and predicting and early warning how long when the amount of the lithium precipitation will be very large.

And then judging whether an inflection point exists in the extracted voltage-time data and judging the time of the inflection point from the cut-off time. The definition of the inflection point on the continuous function is the point where the second derivative is 0 and the left and right second-order derivatives change sign. As intuitively seen, the voltage-time data is a graph of a curve, the inflection point is a point where the curve changes convexity, i.e., from being convex up to being convex down before and after this point, or vice versa. But for discrete data, it is defined as the point before and after which the second order difference quotient changes sign.

Step S4, threshold judgment and classification.

Grading the time from the inflection point time at which said inflection point occurs to the cut-off time.

For an inflection point that exists, when the inflection point time is less than threshold 4, a log of the inflection point time is established/created.

For those whose inflection point time reaches threshold 5, they are forced to retire.

If the inflection point time is greater than threshold 4 and less than threshold 5, the data of each charging or discharging is simulated. Here, the amount of lithium deposited in the charging or discharging is obtained through artificial intelligence parameter identification and electrochemical simulation. A log file is created for the amount of the lithium precipitation. At the same time, the current working condition and temperature need to be obtained during the simulation.

And judging whether the amount of the lithium precipitation is larger than threshold 6 and smaller than threshold 7, and calculating and predicting the time of reaching threshold 7 through a time sequence model or an artificial intelligence model.

And predicting and early warning the time of reaching threshold 7, and if the amount of the lithium precipitation reaches threshold 7, it is forcibly retired.

In one embodiment, the invention provides a system for detecting the lithium precipitation of a lithium battery. As shown in FIG. 2, the system includes an acquisition module 101, an extraction module 102, a judgment module 103, a grade module 104, and a detection module 105.

The acquisition module 101 is configured to acquire the voltage-time data of a lithium battery of one module.

The extraction module 102 is configured to perform feature extraction on the voltage-time data to obtain voltage-time data of charging and discharging that meets a preset range.

The judgment module 103 is configured to perform inflection point judgment on the charging and discharging voltage-time data.

The grade module 104 is configured to determine the existence of the inflection point and grade the inflection time at which the inflection point occurs.

The detection module 105 is configured to detect/monitor a lithium precipitation amount of the lithium battery based on the level of the inflection point time.

In one embodiment, the extraction module is further configured to judge whether the charging and discharging voltage-time data meet the preset range, or not, which specifically comprises the steps of:

judging whether the voltage value within a first time threshold after the charging or discharging is cut off is lower than a second voltage threshold;

if so, judging whether the time of the voltage value that is lower than the second voltage threshold is lower than a third time threshold, or not; and if so, determining that the charging and discharging voltage-time data meets the preset range.

In one embodiment, the grading module is configured to calculating the time difference between the inflection point time and the cut-off time in the charging and discharging voltage-time data; and grading the inflection point time according to the time difference.

Briefly, the invention adopts the method of combining data feature extraction and electrochemical model in big data, and establishes a series of log and threshold system to detect and monitor lithium precipitation and early warn for lithium batteries.

The foregoing description of the exemplary embodiments of the invention has been presented only for the purposes of illustration and description and is not intended to be exhaustive or to limit the invention to the precise forms disclosed. Many modifications and variations are possible in light of the above teaching. The embodiments were chosen and described in order to explain the principles of the invention and their practical application so as to enable others skilled in the art to utilize the invention and various embodiments and with various modifications as are suited to the particular use contemplated. Alternative embodiments will become apparent to those skilled in the art to which the invention pertains without departing from its spirit and scope. Accordingly, the scope of the invention is defined by the appended claims rather than the foregoing description and the exemplary embodiments described therein.

What is claimed is:

1. A method for detecting lithium precipitation of lithium batteries, comprising:

acquiring voltage-time data of lithium batteries of a battery module;

performing feature extraction on the voltage-time data to obtain voltage-time data of charging and discharging in accordance with a preset range;

performing an inflection point judgment on the voltage-time data of the charging and discharging;

determining that there exists the inflection point, and grading the inflection point time when the inflection point occurs; and detecting an amount of lithium precipitation of the lithium batteries based on the grade of the inflection point time, wherein said performing the feature extraction on the voltage-time data to obtain the voltage-time data of charging and discharging in accordance with the preset range comprises:

judging whether the charging and discharging voltage-time data meet the preset range, or not, comprising the steps of:

judging whether the voltage value within a first time threshold after the charging or discharging is cut off is lower than a second voltage threshold;

if so, judging whether the time of the voltage value that is lower than the second voltage threshold is lower than a third time threshold, or not; and if so, determining that the charging and discharging voltage-time data meets the preset range.

2. The method of claim 1, wherein said determining that there exists the inflection point, and said grading the inflection point time when the inflection point occurs comprises:

calculating a time difference between the inflection point time and the cut-off time in the charging and discharging voltage-time data; and grading the inflection point time according to the time difference.

3. A method for detecting lithium precipitation of lithium batteries, comprising:

acquiring voltage-time data of lithium batteries of a battery module;

performing feature extraction on the voltage-time data to obtain voltage-time data of charging and discharging in accordance with a preset range;

performing an inflection point judgment on the voltage-time data of the charging and discharging;

determining that there exists the inflection point, and grading the inflection point time when the inflection point occurs; and detecting an amount of lithium precipitation of the lithium batteries based on the grade of the inflection point time, wherein said detecting an amount of lithium precipitation of the lithium batteries based on the grade of the inflection point time comprises:

when the inflection point time is smaller than a fourth time threshold, establishing a log file of the inflection point time; and when the inflection point time reaches a fifth time threshold, forcing the lithium battery to stop operating;

wherein a maximum value of the fourth time threshold is less than a minimum value of the fifth time threshold.

4. The method of claim 3, wherein said detecting an amount of lithium precipitation of the lithium batteries based on the grade of the inflection point time further comprises:

when the inflection point time is greater than the fourth time threshold and smaller than the fifth time threshold, performing analog simulation on the charging data or the discharging data of the lithium battery to obtain a corresponding amount of the lithium precipitation; and establishing a log file for the amount of the lithium precipitation.

5. The method of claim 4, wherein said establishing the log file of the amount of the lithium precipitation comprises:

when the amount of the lithium precipitation is determined to be larger than a sixth lithium precipitation amount threshold and smaller than a seventh lithium precipitation amount threshold, calculating the time when the amount of the lithium precipitation reaches the seventh lithium precipitation amount threshold through a time sequence model or an artificial intelligence model; and early warning the amount of the lithium precipitation based on the time when the amount of the lithium precipitation reaches the seventh lithium precipitation amount threshold value.

6. The method of claim 5, further comprising:

when the amount of the lithium precipitation reaches the seventh lithium precipitation amount threshold, forcing the lithium battery to stop operating.

7. A system for detecting lithium precipitation of lithium batteries, comprising:

an acquisition module, configured to acquire voltage-time data of a lithium battery of one module;

an extraction module, configured to perform feature extraction on the voltage-time data to obtain voltage-time data of charging and discharging that meets a preset range;

a judgment module, configured to perform inflection point judgment on the charging and discharging voltage-time data;

a grade module, configured to determine the existence of the inflection point and grade the inflection time at which the inflection point occurs; and a detection module, configured to detect a lithium precipitation amount of the lithium battery based on the level of the inflection point time, wherein the extraction module is further configured to:

judge whether the charging and discharging voltage-time data meets the preset range, or not, comprising the steps of:

judging whether the voltage value within a first time threshold after the charging or discharging is cut off is lower than a second voltage threshold;

if so, judging whether the time of the voltage value that is lower than the second voltage threshold is lower than a third time threshold, or not; and if so, determining that the charging and discharging voltage-time data meets the preset range.

8. The system of claim 7, wherein the grade module is further configured to:

calculate the time difference between the inflection point time and the cut-off time in the charging and discharging voltage-time data; and grading the inflection point time according to the time difference.

* * * * *